(12) United States Patent
Chu et al.

(10) Patent No.: US 8,074,128 B2
(45) Date of Patent: Dec. 6, 2011

(54) BLOCK MANAGEMENT AND REPLACEMENT METHOD, FLASH MEMORY STORAGE SYSTEM AND CONTROLLER USING THE SAME

(75) Inventors: Chien-Hua Chu, Hsinchu County (TW); Chih-Kang Yeh, Kinmen County (TW); Horng-Sheng Yan, Penghu County (TW)

(73) Assignee: Phison Electronics Corp., Miaoli (TW)

( * ) Notice: Subject to any disclaimer, the term of this patent is extended or adjusted under 35 U.S.C. 154(b) by 232 days.

(21) Appl. No.: 12/328,467

(22) Filed: Dec. 4, 2008

(65) Prior Publication Data

US 2010/0088540 A1    Apr. 8, 2010

(30) Foreign Application Priority Data

Oct. 6, 2008 (TW) ................................ 97138395 A

(51) Int. Cl.
*G11C 29/00* (2006.01)
(52) U.S. Cl. ....................................................... 714/710
(58) Field of Classification Search .................. 714/710, 714/718, 723
See application file for complete search history.

(56) References Cited

U.S. PATENT DOCUMENTS

| | | | | |
|---|---|---|---|---|
| 6,877,118 B2 * | 4/2005 | Oshima et al. | ................. | 714/719 |
| 7,415,636 B2 * | 8/2008 | Takahashi | ........................ | 714/42 |
| 7,421,629 B2 * | 9/2008 | Bucksch et al. | ............... | 714/718 |
| 7,434,122 B2 * | 10/2008 | Jo | .................................. | 714/723 |
| 7,444,577 B2 * | 10/2008 | Best et al. | ...................... | 714/745 |
| 7,451,367 B2 * | 11/2008 | Pedersen | ........................ | 714/718 |
| 7,454,671 B2 * | 11/2008 | Adsitt | ............................ | 714/719 |
| 7,502,977 B2 * | 3/2009 | Venkatraman et al. | ........ | 714/718 |
| 7,529,998 B2 * | 5/2009 | Reblewski | ..................... | 714/733 |
| 7,657,803 B2 * | 2/2010 | Chae | .............................. | 714/718 |
| 7,757,133 B1 * | 7/2010 | Parulkar | ........................ | 714/718 |
| 7,793,035 B2 * | 9/2010 | Oshima et al. | ................. | 711/103 |
| 7,849,382 B2 * | 12/2010 | Kasahara et al. | .............. | 714/763 |
| 2009/0259896 A1 * | 10/2009 | Hsu et al. | ....................... | 714/723 |

* cited by examiner

*Primary Examiner* — James C Kerveros
(74) *Attorney, Agent, or Firm* — J.C. Patents

(57) ABSTRACT

A block management and replacement method for a flash memory is provided. The method includes grouping physical blocks of the flash memory into physical units and dividing the physical units as a usage area and a replacement area, wherein the physical blocks grouped into the same physical unit are accessed by using a multi-planes accessing command. The method also includes when one of the physical block of the physical unit in the usage area is damaged, replacing the physical unit having the damaged physical block with one physical unit selected from the replacement area and recording the undamaged physical block within the replaced physical unit if there is an applicable physical unit in the replacement area; and replacing the damaged physical block with one physical block selected from the replacement area if there is no applicable physical unit but an undamaged physical block in the replacement area.

18 Claims, 6 Drawing Sheets

(a)

(b)

BLOCK MANAGEMENT AND REPLACEMENT METHOD, FLASH MEMORY STORAGE SYSTEM AND CONTROLLER USING THE SAME

CROSS-REFERENCE TO RELATED APPLICATION

This application claims the priority benefit of Taiwan application serial no. 97138395, filed on Oct. 6, 2008. The entirety of the above-mentioned patent application is hereby incorporated by reference herein and made a part of specification.

BACKGROUND

1. Technology Field

The present invention relates to a block management and replacement method for a flash memory, and a flash memory storage system and a controller using the same. More particularly, the present invention relates to a block management and replacement method for a flash memory chip having multi block planes, and a flash memory storage system and a controller using the same.

2. Description of Related Art

With a quick developing of digital camera, cell phone camera and MP3, demand of storage media by customers is increased greatly. Since a flash memory has the advantages of non-volatile, energy saving, small size and none mechanical structure etc., it is suitable for portable applications, and especially for portable battery-powered products. A solid state drive is a storage device applying an NAND flash memory as a storage medium thereof.

Generally, a flash memory die within a flash memory chip of the flash memory storage system is divided into a plurality of physical units, and the physical units are generally consisted of a physical block or a plurality of physical blocks. The physical units are generally grouped into a data area and a spare area. The physical units grouped in the data area can store valid data written according to a writing command, and the physical units grouped in the spare area are used for replacing the physical units of the data area during execution of the writing command. To be specific, when the flash memory storage system receives the writing command from a host to perform writing to the physical units of the data area, the flash memory storage system selects the physical units from the spare area, and writes old valid data stored in the physical units to be updated within the data area and new data to be written into the physical units selected from the spare area, and then associates the physical units written with the new data to the data area, and erases the original physical units of the data area and associates it to the spare area. For the host to smoothly access the physical units storing data in an alternate approach, logical units are configured to the flash memory storage system for being provided to the host to access, wherein the logical units are configured in a size of one or a plurality of physical blocks according to the physical units. Namely, the flash memory storage system can establish a logical-physical address mapping table, in which a mapping relation of the logical units and the physical units of the data area are recorded and updated for reflecting alternation of the physical units, so that the host can only perform the accessing based on the provided logical units, and accordingly the flash memory storage system can read data from or write data into the mapped physical units according to the logical-physical address mapping table.

Moreover, a part of the physical units is maintained in a general flash memory chip to serve as a replacement area, which is used for replacing damaged physical units when the physical units of the data area or the spare area are damaged. Particularly, to improve an accessing speed of the flash memory chip having multi block planes, the physical unit formed by a plurality of physical blocks that is belonged to different block planes and suitable for executing multi-planes accessing commands is generally used for performing the accessing. In this case, if one of the physical block in the physical unit is damaged, the flash memory storage system can replace the physical unit having the damaged physical block in a unit of a whole physical unit, so that data accessing thereof can still be performed according to the multi-planes accessing mode. Such a replacement operation can be executed until there is no available physical unit can be used for replacing the damaged physical unit, and now the flash memory storage system is regarded as useless and cannot be used any more.

However, the replaced damaged physical unit actually still has undamaged physical blocks, so that the aforementioned block management and replacement method can cause a waste of storage space of the flash memory storage system, and accordingly lifespan of the flash memory storage system is shortened.

SUMMARY

Accordingly, the present invention is directed to a block management and replacement method, by which a data writing efficiency of a flash memory storage system can be improved, and a lifespan of the flash memory storage system is prolonged.

The present invention is directed to a controller, which can use the aforementioned block management and replacement method for managing a flash memory chip, so as to improve a data writing efficiency of a flash memory storage system and prolong the lifespan of the flash memory storage system.

The present invention is directed to a storage system, in which the aforementioned block management and replacement method can be used for managing a flash memory chip, so as to improve a data writing efficiency of a flash memory storage system and prolong the lifespan of the flash memory storage system.

The present invention provides a block management and replacement method for a flash memory storage system, wherein the flash memory storage system has a plurality of physical block. The block management and replacement method includes dividing the physical blocks into a plurality of physical units and grouping the physical units as a usage area and a replacement area, wherein the physical blocks of each of the physical units are accessible by using a multi-planes accessing command. The block management and replacement method also includes judging whether the number of the undamaged physical units in the replacement area is bigger than a predetermined value when one of the physical blocks of the physical unit in the usage area is damaged, wherein if the number of the undamaged physical units in the replacement area is bigger than the predetermined value, one of the undamaged physical units is selected from the replacement area for replacing the physical unit having the damaged physical block in the usage area in a unit of the physical unit to be accessible by the multi-planes accessing command, and the undamaged physical blocks or the damaged physical blocks in the replaced physical unit are recorded. Moreover, if the number of the undamaged physical units in the replacement area is not bigger than the predetermined value, one of the undamaged physical blocks is selected from the replacement area for replacing the damaged physical block in a unit of the physical block.

The present invention provides a flash memory storage system and a controller thereof. The flash memory storage system includes a flash memory chip, a connector and a controller, wherein the flash memory chip has a plurality of physical blocks. The controller is electrically connected to the flash memory chip and the connector, and the controller includes a microprocessor unit and a flash memory interface module, a buffer memory, a host interface module and a memory management module coupled to the microprocessor unit. Particularly, the memory management module has a plurality of machine commands that can be executed by the microprocessor unit, so as to implement the aforementioned block management and replacement method to the flash memory.

According to the method of the present invention, if the replacement area still has the physical units consisted of the physical blocks that can be accessed by using the multi-planes accessing command, the damaged physical blocks are replaced in a unit of the physical unit, and if the replacement area does not have the physical unit consisted of the physical blocks that can be accessed by using the multi-planes accessing command, the damaged physical blocks are replaced in a unit of the physical block. By such means, accessing efficiency of the flash memory storage system can be effectively improved, and the lifespan of the flash memory storage system can be prolonged.

In order to make the aforementioned and other objects, features and advantages of the present invention comprehensible, a preferred exemplary embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF EXEMPLARY
EMBODIMENTS

The accompanying drawings are included to provide a further understanding of the invention, and are incorporated in and constitute a part of this specification. The drawings illustrate exemplary embodiments of the invention and, together with the description, serve to explain the principles of the invention.

Figure 1:
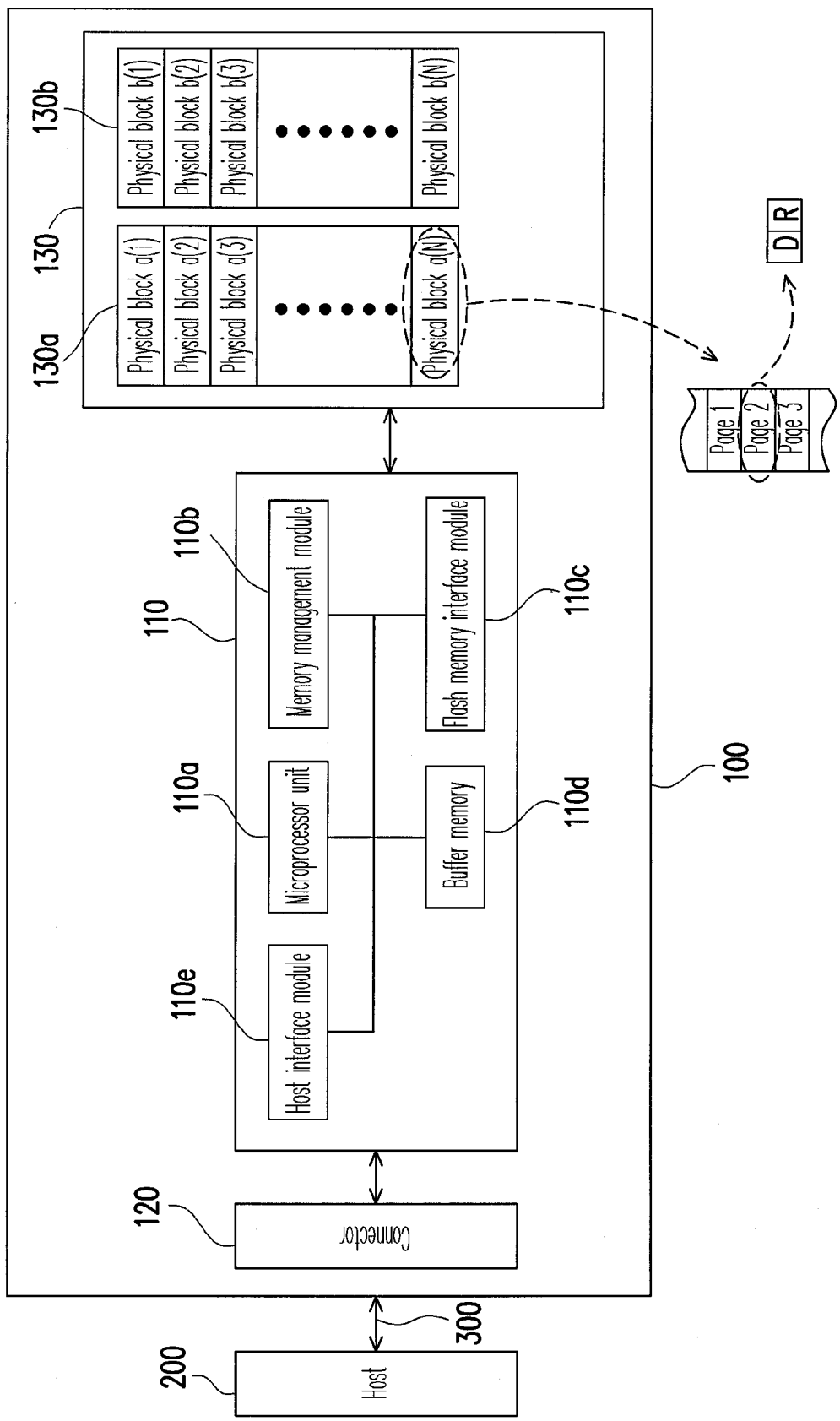
FIG. 1 is a schematic block diagram illustrating a flash memory storage system according to an exemplary embodiment of the present invention.

FIG. 1 is a schematic block diagram illustrating a flash memory storage system according to an exemplary embodiment of the present invention. Referring to FIG. 1, the flash memory storage system 100 includes a controller (which is also referred to as a controller system) 110, a connector 120 and a flash memory chip 130.

Generally, the flash memory storage system 100 is utilized together with a host 200, so that the host 200 can write data into the flash memory storage system 100 or read data from the flash memory storage system 100. In the present invention, the flash memory storage system 100 is a solid state drive (SSD). It should be understood that in another exemplary embodiment of the present invention, the flash memory storage system 100 can also be a memory card or a flash drive.

The controller 110 may execute a plurality of commands with a hardware type or a firmware type to perform operations such as data storing, data reading and data erasing, etc. in coordination with the connector 120 and the flash memory chip 130. The controller 110 includes a microprocessor unit 110a, a memory management module 110b, a flash memory interface module 110c, a buffer memory 110d and a host interface module 110e.

The microprocessor unit 110a is used in coordination with the memory management module 110b, the flash memory interface module 110c, the buffer memory 110d and the host interface module 110e to perform various operations of the flash memory storage system 100.

The memory management module 110b is coupled to the microprocessor unit 110a. The memory management module 110b has a plurality of machine commands, which when executed by the microprocessor unit 110a, to manage the flash memory chip 130. For example, the machine commands are executed for wear levelling, managing blocks, maintaining a logical-physical address mapping table, etc. Particularly, in the present exemplary embodiment, the memory management module 110b contains machine commands that can implement the block management and replacement steps of the present exemplary embodiment.

In the present exemplary embodiment, the memory management module 110b is embodied in form of firmware within the controller 110, for example, the memory management module 110b is embodied by a program memory (for example, a read only memory (ROM)) and the related machine commands stored therein. During operation of the flash memory storage system 100, a plurality of the machine commands of the memory management module 110 is indirectly loaded into the buffer memory 110d for being executed by the microprocessor unit 110a, or directly executed by the microprocessor unit 110a to implement the aforementioned functions of wear levelling, managing bad blocks, and maintaining the logical-physical address mapping table, etc. Particularly, the controller 110 can execute the plurality of machine commands of the memory management module 110b to implement the block management and replacement steps of the present exemplary embodiment.

In another exemplary embodiment of the present invention, the machine commands of the memory management module 110b can also be stored in a specific area (for example, a system area) of the flash memory 130 in form of the firmware. Similarly, during operation of the flash memory storage system 100, the plurality of machine commands of the memory management module 110 is loaded into the buffer memory 110d for being executed by the microprocessor unit 110a.

Moreover, in still another exemplary embodiment of the present invention, the memory management module 110b can also be embodied in the controller 110 in form of hardware.

The flash memory interface module 110c is coupled to the microprocessor unit 110a, and is used for accessing the flash memory chip 130. Namely, data to be written into the flash memory chip 130 by the host 200 is transformed into a format that can be accepted by the flash memory chip 130 via the flash memory interface module 110c.

The buffer memory 110d is coupled to the microprocessor unit 110a and is used for temporarily storing system data (for example, the logical-physical address mapping table) or data read or written by the host 200. In the present exemplary embodiment, the buffer memory 110d is a static random access memory (SRAM). However, it should be understood that the present invention is not limited thereof, and a dynamic random access memory (DRAM), a magnetoresistive random access memory (MRAM), a phase change random access memory (PRAM) or other suitable memories can also be applied.

The host interface module 110e is coupled to the microprocessor unit 110a and is used for receiving and identifying commands sent from the host 200. Namely, the commands and data sent by the host 200 are transmitted to the microprocessor unit 110a via the host interface module 110e. In the present exemplary embodiment, the host interface module 110e is a SATA interface. However, it should be noted that the present invention is not limited thereto, and the host interface module 110e can also be a USB interface, an IEEE 1394 interface, a PCI Express interface, a MS interface, a MMC interface, a SD interface, a CF interface, an IDE interface or other suitable data transmission interfaces. Particularly, the host interface module 110e corresponds to the connector 120. Namely, the host interface module 110e has to be used in coordination with the connector 120.

Moreover, though not illustrated in figures, the controller 110 can further include general functional modules such as an error correction module and a power supply management module, etc. for controlling the flash memory.

The connector 120 is configured for connecting the host 200 via a bus 300. In the present exemplary embodiment, the connector 120 is a SATA connector. However, it should be understood that the present invention is not limited thereto, and the connector 120 can also be a USB connector, an IEEE 1394 connector, a PCI Express connector, a MS connector, a MMC connector, a SD connector, a CF connector, an IDE connector or other suitable connectors.

The flash memory chip 130 is coupled to the controller 110 and is used for storing data. In the present exemplary embodiment, the flash memory chip 130 is a multi level cell (MLC) NAND flash memory. However, it should be noted that the present invention is not limited thereto, and in another exemplary embodiment, a single level cell (SLC) NAND flash memory can also be applied.

In the present exemplary embodiment, the flash memory chip 130 includes a first block plane 130a and a second block plane 130b. The first block plane 130a and the second block plane 130b respectively include a plurality of physical blocks. Particularly, the first block plane 130a and the second block plane 130b can be physical divisions or virtual divisions.

It should be noted that though the in the present exemplary embodiment, two block planes are taken as an example, the present invention is not limited thereto, and the flash memory chip including arbitrary number of the block planes can also be applied. Moreover, in the present exemplary embodiment, the first block plane 130a and the second block plane 130b of one flash memory die (not shown) of the flash memory chip 130 are taken as an example. However, the present invention can also be applied to the flash memory chip having a plurality of flash memory dies. Similarly, though in the present exemplary embodiment, only one flash memory chip is described, the present invention can also be applied to the flash memory storage system having a plurality of flash memory chips.

Generally, the physical block is a minimum unit that can be erased within the flash memory. Namely, each block contains a minimum number of memory cells that can be erased together. Each block is generally divided into a plurality of pages, and the page is the minimum unit that can be programmed. It should be noted that according to different designs of the flash memory, the minimum programmable unit can also be a sector. Namely, the page can be divided into a plurality of the sectors, and the sector is the minimum unit that can be programmed. In other words, the page is the minimum unit that data can be written on or read from. Each page generally includes a user data area D and a redundant area R. The user data area is used for storing a user data, and the redundant area is used for storing a system data (for example, an error correcting code (ECC)).

To operate with a size of the sector of the disk drive, the user data area D is generally 512 bytes, and the redundant area is generally 16 bytes. Namely, one page is one sector. However, the page may also include a plurality of the sectors. In the present exemplary embodiment, one page of a flash memory block may include 4 sectors.

Generally, the block may include arbitrary number of pages, for example, 64 pages, 128 pages, 256 pages, etc. Moreover, the physical blocks in the first block plane 130a or the second block plane 130b are generally grouped into a plurality of zones, and managing of the memory based on the zones results in the fact that the zones can be operated independently, so as to increase a parallel degree of operation, and simplify a complexity of management.

Moreover, the controller 110 can configure the plurality of physical blocks in the first block plane 130a and the second block plane 130b as a physical unit for management. For example, one physical unit includes two physical blocks. During managing of the memory based on the physical unit, since the controller 110 maintains the logical-physical address mapping table based on a relatively great unit (i.e. the physical unit), utilization space of the buffer memory 110d can be saved.

Particularly, in the present exemplary embodiment, the controller 110 can simultaneously access specific physical blocks in the first block plane 130a and the second block plane 130b via a multi-planes accessing mode. Namely, in the flash memory chip 130, the specific physical block in the first block plane 130a and the specific physical block in the second block plane 130b can be simultaneously operated (for example, write, read and erase) in response to a multi-planes accessing command. Therefore, the controller 110 can further configure the physical blocks having a simultaneous operating relation into a physical unit. To be specific, in a specific flash memory chip, a multi-planes accessing command could trigger data accessing of some of the block planes during at least partially action time, so as to shorten time required for accessing data. Therefore, the specific block planes that can be accessed simultaneously during at least partially action time, by a simultaneous method comprising a multi-planes accessing command are regarded to have the simultaneous operating relation, and the data accessing mode performed based on the simultaneous method is referred to as the multi-planes accessing mode.

Figure 2:
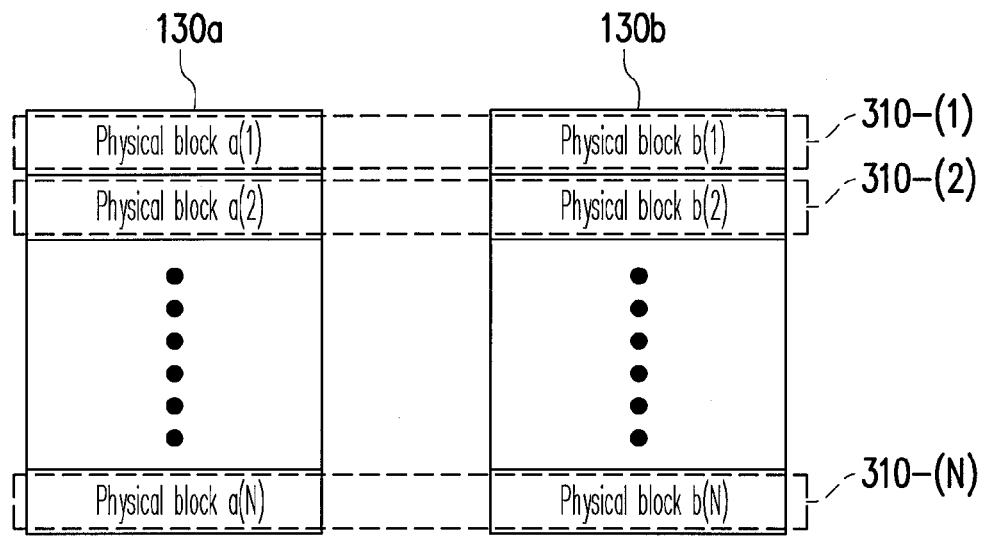
FIG. 2 is a block diagram illustrating a flash memory chip according to an exemplary embodiment of the present invention.

FIG. 2 is a block diagram illustrating a flash memory chip according to an exemplary embodiment of the present invention. Referring to FIG. 2, the physical blocks of the first block plane 130a and the second block plane 130b can be grouped into physical units 310-1~310-N.

FIGS. 3A-3D are schematic diagrams illustrating operations of the physical units in the first block plane 130a and the second block plane 130 according to an exemplary embodiment of the present invention.

It should be noted that the terms used for describing operations of the flash memory such as "select", "move", "exchange", "replace", "alternate", "divide", and "group" etc. for operating the physical blocks of the flash memory chip 130 are only logical concepts. Namely, the physical blocks of the flash memory are only operated logically, and actual positions of the physical blocks are not changed. It should be noted that the following operations are implemented by executing the machine commands of the memory management module 110b via the controller 110.

Figure 3A:
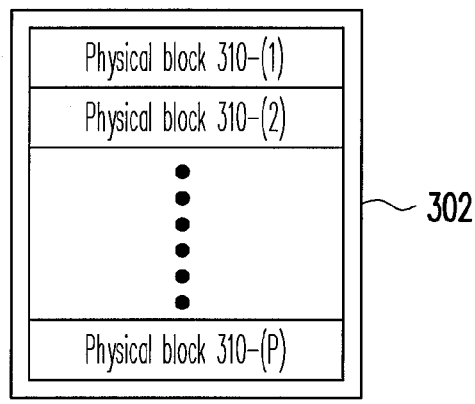
FIG. 3A is diagram illustrating a usage area and a replacement area of a flash memory chip according to an exemplary embodiment of the present invention.
Figure 3A:
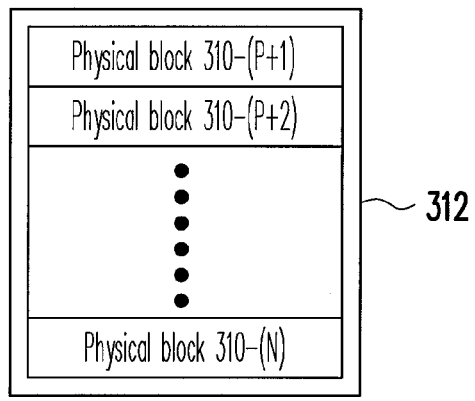

FIG. 3A is a diagram illustrating a usage area and a replacement area of a flash memory chip according to an exemplary embodiment of the present invention.

Referring to FIG. 3A, in the present exemplary embodiment, to effectively program (i.e. write) data, the controller 110 can logically group the physical units of FIG. 2 into a usage area 302 and a replacement area 312.

The physical units 310-(1)~310-(P) in the usage area 302 are normally used physical units of the flash memory storage system 100. Namely, the controller 110 can write data into the physical units belonged to the usage area 302.

The physical units 310-(P+1)~310-(N) in the replacement area 312 are replacing physical units. 4% physical blocks of the flash memory chip 130 are pre-reserved for replacement utilization when the flash memory chip 130 is manufactured. Namely, when the physical blocks in the usage area 302 are damaged, the pre-reserved physical blocks of the replacement area 312 can be used for replacing the damaged physical blocks. Therefore, if the replacement area 312 still has applicable physical blocks, when the physical blocks in the usage area 302 are damaged, the controller 110 can select the applicable physical blocks from the replacement area 312 for replacing the damaged physical blocks. If there is no applicable physical block in the replacement area 312, when the physical blocks in the usage area 302 are damaged, the flash memory storage system 100 is then useless. Generally, a predetermined value can be set to the controller 110 for judging whether the flash memory chip 130 can be continually utilized, wherein if a number of the applicable physical blocks in the replacement area 312 is less than the predetermined value, it can be judged that the physical block cannot selected from the replacement area 312 any more. In the present exemplary embodiment, the predetermined value is set to 0. However, the present invention is not limited thereto, and the predetermined value can also be set to 1 or an integer bigger than 1.

Particularly, in the present exemplary embodiment, the controller 110 can replace the damaged physical units or the damaged physical blocks in a unit of the physical unit or physical block, wherein the physical units and the physical blocks area selected from the replacement area 312.

Figure 3B:
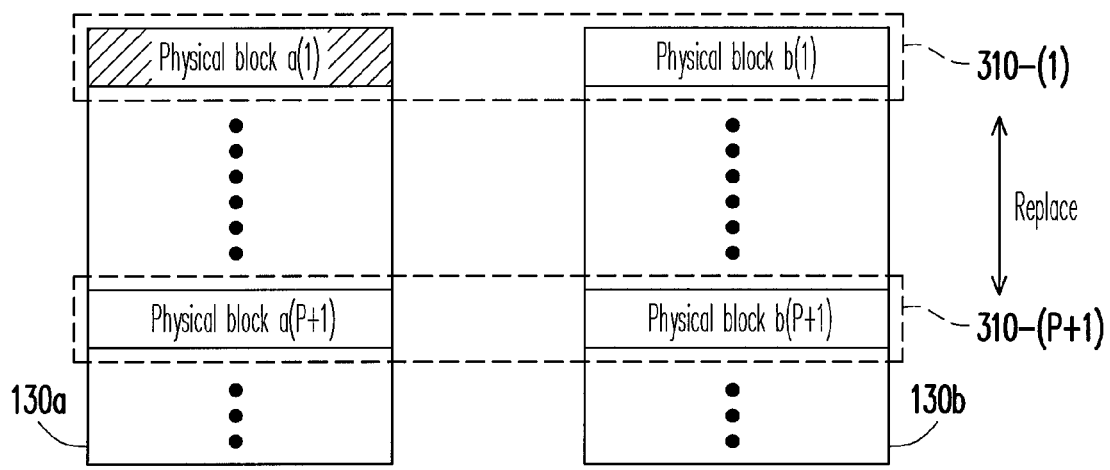
FIG. 3B is a schematic diagram illustrating replacing of blocks between a usage area and a replacement area according to an exemplary embodiment of the present invention.
Figure 3B:
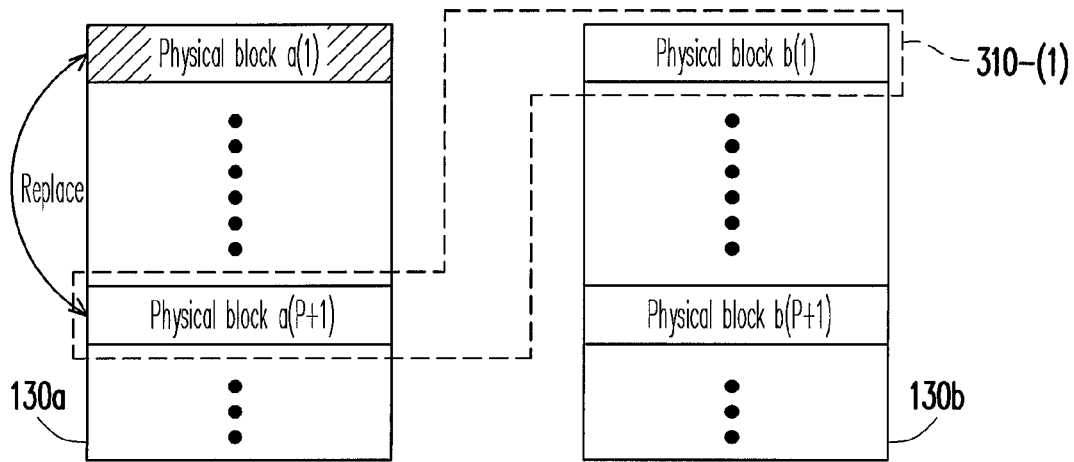

FIG. 3B is a schematic diagram illustrating replacing of blocks between a usage area and a replacement area according to an exemplary embodiment of the present invention.

Referring to FIG. 3B, when a physical block of the usage area 302 is damaged, the controller 110 can replace the damaged block according to two methods. For example, assuming a physical block a(1) of the first block plane 130a is damaged, according to a first method, the controller 110 can replace the whole physical unit 310-(1) with the physical unit 310-(P+1) including a physical block a(P+1) of the first block plane 130a and a physical block b(P+1) of the second block plane 130b (shown as (a) of FIG. 3B). Namely, when the controller 110 needs to access the physical unit 310-(1) later, the controller 110 can access the physical unit 310-(P+1) by reading a replacement record. For example, the replacement record is recorded in the redundant area of the physical block of the physical unit 310-(1). Moreover, according to a second method, the controller 110 can only replace the damaged physical block a(1) of the first block plane 130a with the physical block a(P+1). Namely, when the controller 110 access the physical unit 310-(1), and if an accessing address thereof is the address of the original physical block a(1), the controller 110 can be switched to access the physical block a(P+1). Similarly, such replacement record is recorded in the redundant area of the physical block a(1).

It should be noted that when the controller 110 applies the first method to replace the damaged block, since the replaced physical unit still includes a normal physical block (for example, the physical block b(1) shown in FIG. 3B), the controller 110 can specifically record such information. For example, in an exemplary embodiment of the present invention, such information can be recorded in a replacement table, or can be recorded in the redundant area of the physical block b(1).

The controller 110 can replace the damaged physical block according to the two aforementioned methods, and a specific operation thereof is described in detail below with reference of FIG. 4.

Figure 3C:
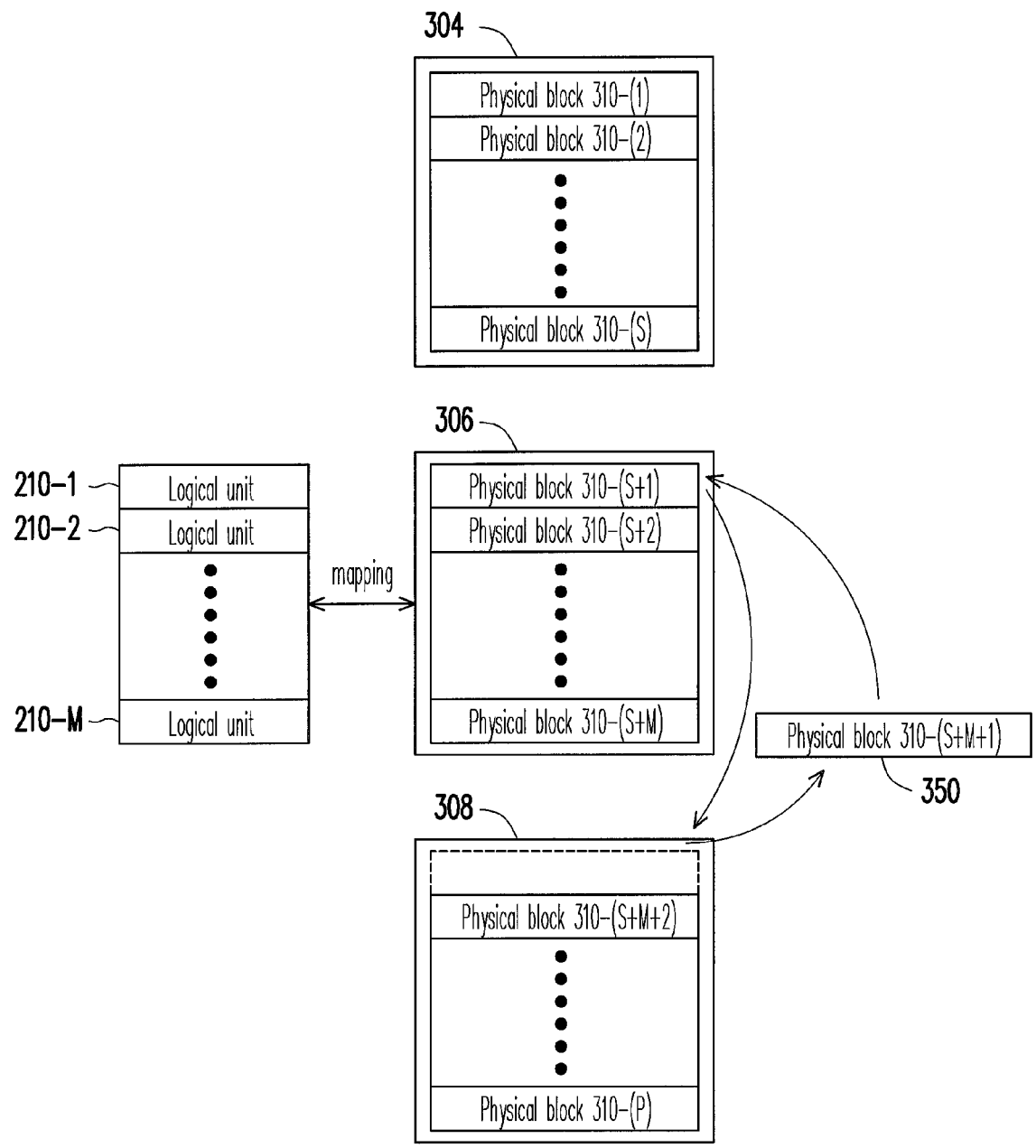
FIG. 3C is a schematic diagram illustrating operations of physical units in a usage area according to an exemplary embodiment of the present invention.

In an exemplary embodiment of the present invention, during operation of the flash memory storage system 100, the controller 110 can group the physical units in the usage area 302 of the flash memory chip 130 into a system area, a data area and a spare area. FIG. 3C is a schematic diagram illustrating operations of physical units in a usage area according to an exemplary embodiment of the present invention. Referring to FIG. 3C, the system area 304 includes the physical units 310-(1)~310-(S), the data area 306 includes the physical units 310-(S+1)~310-(S+M), and the spare area 308 includes the physical units 310-(S+M+1)~310-(P). In the present exemplary embodiment, the aforementioned S, M and P are positive integers representing configured number of the physical blocks of each of the areas, and are determined by flash memory storage system manufactures according to a capacity of the utilized flash memory.

The physical units in the system area 304 are used for recording system data, and the system data includes area number of the first block plane 130a, block number of each area, page number of each physical block, and the logical-physical address mapping table recording a relation between the logical addresses and the physical addresses, etc.

The physical units in the data area 306 are used for storing user's data, and generally include the physical blocks mapping to the logical blocks accessed by the host 200.

The physical blocks in the spare area 308 are used for alternating the physical units in the data area 306, so that the physical blocks in the spare area 308 are empty or applicable blocks, i.e. blocks that are not stored with data or blocks stored with data marked to be invalid. Namely, the physical blocks of the data area 306 and the spare area 308 are alternately used for storing data that the host 200 writes into the flash memory storage system 100.

As described above, the physical units of the flash memory chip 130 are alternately used by the host for storing data. Therefore, the controller 110 can provide logical units 210-

1~210-M to the host 200 for accessing data, and record the physical units mapped to the logical units by maintaining the logical-physical address mapping table.

Figure 3D:
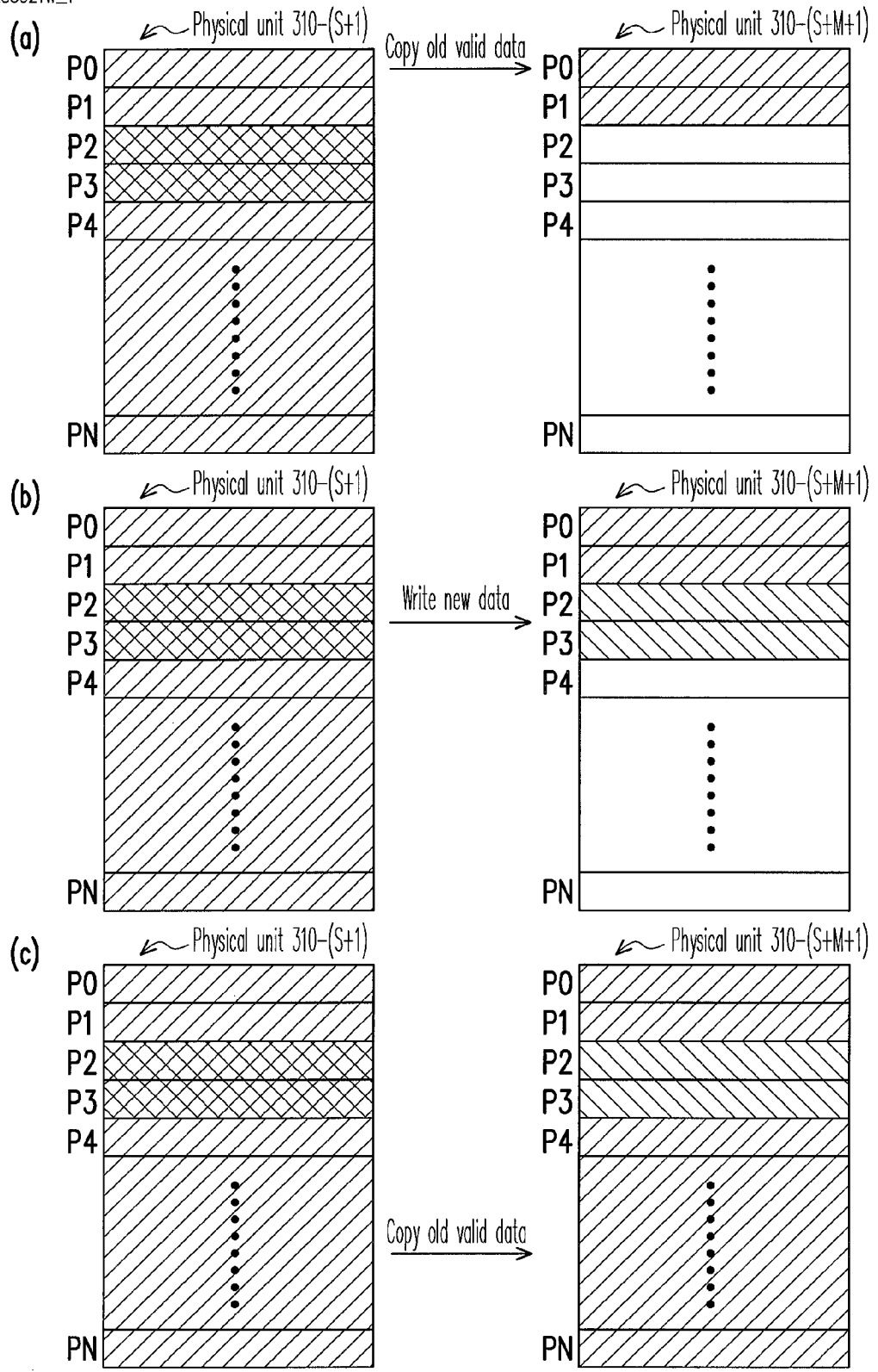
FIG. 3D is a schematic diagram illustrating writing of physical units of FIG. 3C according to an exemplary embodiment of the present invention.

FIG. 3D is a schematic diagram illustrating an example of executing a write command to physical units of FIG. 3C according to an exemplary embodiment of the present invention.

Referring to FIG. 3D, for example, when the host is about to write data to the logical unit 210-1, the controller 110 obtains information that the logical unit is presently mapped to the physical unit 310-(S+1) in the data area 306 via the logical-physical address mapping table. Therefore, the flash memory storage system 100 may update the data stored in the physical unit 310-(S+1). Meanwhile, the controller 110 selects a physical unit 310-(S+M+1) from the spare are 308 to replace the physical unit 310-(S+1) of the data area 306. However, while the new data is written into the physical unit 310-(S+M+1), all of the valid data stored in the physical unit 310-(S+1) may not be immediately moved to the physical unit 310-(S+M+1) for erasing the physical unit 310-(S+1). To be specific, the controller 110 copies the old valid data of the pages (i.e. pages P0 and P1) in the physical unit 310-(S+1) to be written to the physical unit 310-(S+M+1) (shown as (a) of FIG. 3D), and writes the new data (i.e. pages P2 and P3 of the physical unit 310-(S+M+1)) to the physical unit 310-(S+M+1) (shown as (b) of FIG. 3D). Now, the physical unit 310-(S+M+1) containing a part of the old valid data and the written new data is temporarily associated to a substitute physical block 350. This is because the valid data in the physical unit 310-(S+1) may become invalid during a next operation (for example, a write command). Therefore, immediate movement of all of the valid data in the physical unit 310-(S+1) to the physical unit 310-(S+M+1) is unnecessary. In this case, integration of the data in the physical unit 310-(S+1) and the substitute physical unit 310-(S+M+1) is the data in the mapped logical block 210-1. The number of such mother-child blocks (i.e. the physical unit 310-(S+1) and the substitute physical unit 310-(S+M+1)) can be determined by a size of the buffer memory 110d within the controller 110. For example, in the present exemplary embodiment, the flash memory storage system 100 maintains at most five sets of mother-child blocks. An operation for temporarily maintaining such transient relation is referred to as opening of the mother-child blocks.

Next, when the data of the physical unit 310-(S+1) and the data of the substitute physical unit 310-(S+M+1) need to be actually integrated, the controller 110 combines the physical unit 310-(S+1) and the substitute physical unit 310-(S+M+1) to be one physical unit, so as to improve a utilization efficiency of the blocks, and such a combination operation is referred to as closing of the mother-child blocks. For example, as shown in (c) of FIG. 3D, when the mother-child blocks are closed, the controller 110 copies the remained valid data (i.e. pages P4-PN) in the physical unit 310-(S+1) to the substitute physical unit 310-(S+M+1), and erases the physical unit 310-(S+1) and associates it to the spare area 308. Meanwhile, the physical unit 310-(S+M+1) is associated to the data area 306, and the logical unit 210-1 in the logical-physical address mapping table is changed to map to the physical unit 310-(S+M+1), so as to complete an operation of closing the mother-child blocks.

It should be noted that since each of the physical units is formed by the physical blocks belonged to different block planes, when the plurality of physical blocks in the physical unit are accessed, generally, the controller has to respectively perform a single-plane accessing command to each physical block for multiple times, so as to complete the writing or reading. Such mode for sequentially accessing only one physical block is referred to as single-plane accessing mode. However, as described above, according to the circuit layout during fabrication of memory cells, the physical blocks belonged to different block planes have the simultaneous operating relation. Therefore, if the corresponding physical blocks are grouped into one physical unit according to the simultaneous operating relation, when a plurality of the physical blocks in the physical unit is accessed, the controller 110 can simultaneously execute the multi-planes accessing command to the physical blocks to perform the writing or reading operation, so as to improve the data accessing efficiency. Such mode for simultaneously accessing a plurality of the physical blocks is referred to as multi-planes accessing mode.

Therefore, in the present exemplary embodiment, when a physical block of the flash memory chip 130 is damaged, the controller 110 selects a physical unit that can execute the multi-planes accessing from the replacement area 312 in priority for replacing the physical unit having the damaged physical block (shown as (a) of FIG. 3B), so that data accessing of the flash memory storage system 100 can still be performed according to the multi-planes accessing mode with relatively high efficiency after the damaged blocks are replaced.

Figure 4:
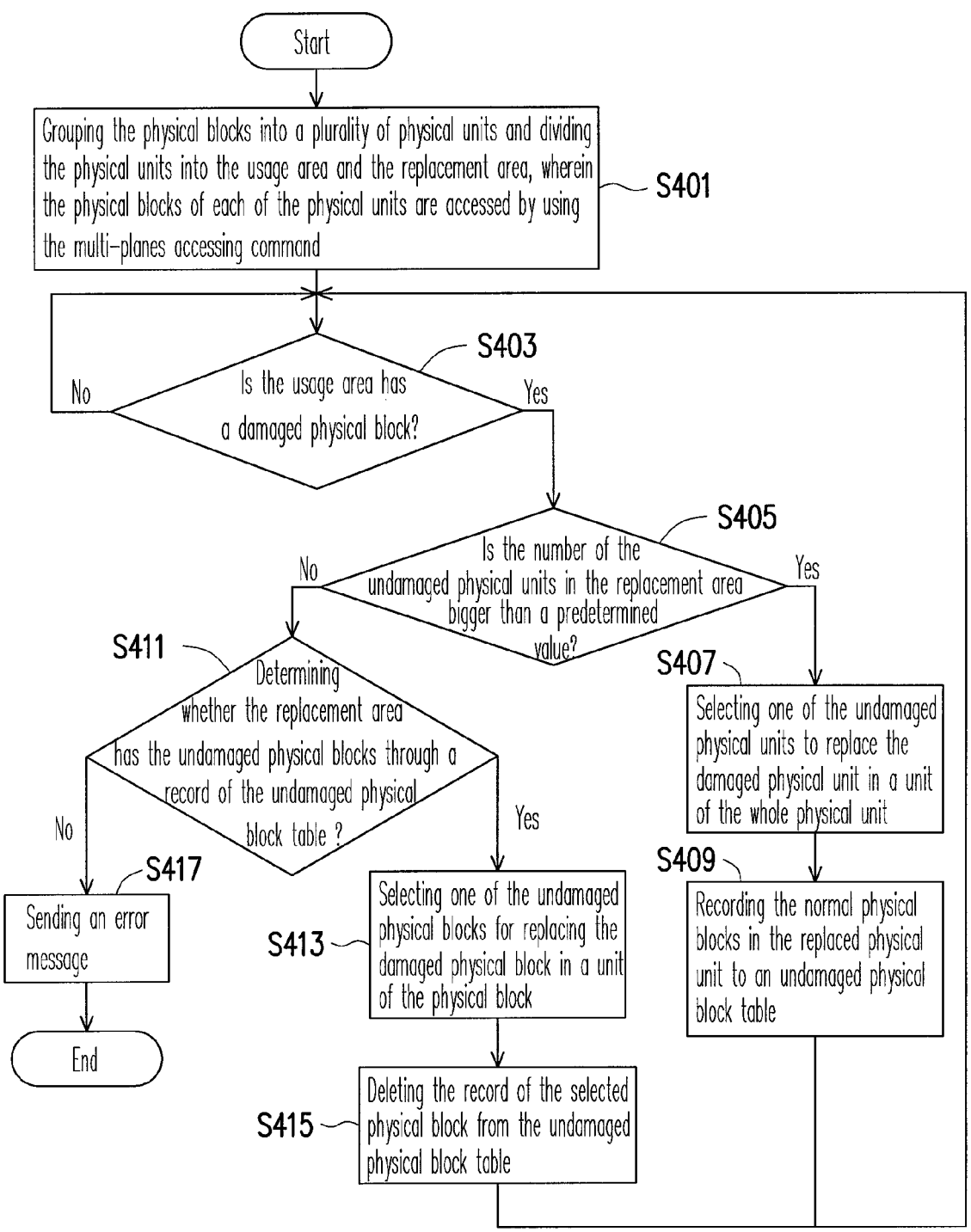
FIG. 4 is a flowchart illustrating block management and replacement steps according to an exemplary embodiment of the present invention.

FIG. 4 is a flowchart illustrating block management and replacement steps according to an exemplary embodiment of the present invention. Wherein these steps are implemented by executing the machine commands of the memory management module 110b via the microprocessor unit 110a of the controller 110. It should be noted that execution sequence of the block management steps is not limited as that shown in FIG. 4, and those skilled in the art can arbitrarily arrange the block management steps according to the spirit of the present invention.

Referring to FIG. 4, when the flash memory storage system 100 is connected to the host 200 and is activated, the controller 110 is initialised, wherein the physical blocks in the first block plane 130a and the second block plane 130 are grouped into a plurality of physical units and the physical units are grouped as the usage area 302 and the replacement area 312, wherein the physical blocks of each of the physical units are accessed by using the multi-planes accessing command (step S401). Particularly, the controller 110 can divide the usage area 302 into the system area 304, the data area 306 and the spare area 308.

Next, during operation of the flash memory storage system 100, the controller 110 can continually judge whether the usage area 302 has a damaged physical block (step S403). To be specific, during data writing, the controller 110 confirms whether a writing state is normal, and during data reading, the controller 110 confirms whether the read data is correct, so as to determine whether the accessed physical block is damaged. If the controller 110 confirms that the physical block is damaged, in step S405, the controller 110 determines whether a number of the undamaged physical units in the replacement area 312 is bigger than a predetermined value (in the present exemplary embodiment, the predetermined value is set to 0, though such value can be set to other suitable integers such as 1 or 2 according to actual requirements), wherein the so-called undamaged physical unit represents that the all of the physical blocks in such physical unit are normal and can be accessed based on the multi-planes accessing mode. To be specific, in the step S405, whether there are enough undamaged physical units in the replacement area 312 is determined.

If the number of the undamaged physical units in the replacement area 312 is bigger than the predetermined value (i.e., there are enough undamaged physical units in the replacement area 312), in step S407, the controller 110 can select one of the undamaged physical units to replace the damaged physical unit in a unit of the whole physical unit, and in step S409, the controller 110 records a related information in a replacement table (not shown). For example, in an exemplary embodiment of the present invention, the replacement table may record physical blocks that can still be used within the replaced physical unit. For example, in another exemplary embodiment of the present invention, the replacement table may record the replaced physical unit, and the physical block that can still be used is identified according to a mark in the redundant area of each of the physical block. Moreover, besides applying the aforementioned replacement table, in another exemplary embodiment of the present invention, in the step S409, in case that the aforementioned replacement table is not applied, only a mark can be recorded in the redundant area of the undamaged physical block for notifying that such physical block is normal, or a mark can be recorded in the redundant area of the damaged physical block for notifying that such physical block is damaged. Alternatively, both of the physical blocks can be marked, and during booting and initialising of the flash memory storage system 100, the controller 110 can obtain a state of the physical block by scanning or reading the redundant area of the physical block.

If the number of the undamaged physical units in the replacement area 312 is not bigger than the predetermined value (i.e., there is no enough undamaged physical units in the replacement area 312), in step S411, the controller can determine whether the replacement area 312 has the undamaged physical blocks through a record of the replacement table.

If in the step S411, the replacement area 312 is determined to have the undamaged physical blocks, in step S413, one of the undamaged physical blocks is selected for replacing the damaged physical block in a unit of the physical block, and in step S415, the controller 110 deletes the selected physical block from the record of the replacement table. If in the step S411, the replacement area 312 is determined to have no undamaged physical block, in step S417, the controller 110 sends an error message for notifying the host 300 that the flash memory storage system 100 cannot store data any more.

Though not illustrated in FIG. 4, those skilled in the art can easy understand that the block management and replacement steps of FIG. 4 are ended when the damaged physical blocks cannot be replaced, and are also ended when a shut down command or a power off command is received.

In summary, when the flash memory storage system of the present invention is initialised, the physical blocks that can be accessed according to the multi-planes accessing mode are grouped into a plurality of the physical units, so that the accessing speed of the flash memory chip can be improved based on the multi-planes accessing mode. Moreover, when the physical blocks are damaged, and if the replacement area has the physical units that can be accessed according to the multi-planes accessing mode, the physical unit having the damaged blocks is replaced in a unit of the physical unit, so that the data accessing can still be performed according to the multi-planes accessing mode. Moreover, the physical blocks within the replaced physical unit than can still be used are recorded, and when the physical blocks are damaged, and meanwhile the replacement area has no normal physical unit, the recorded physical blocks that can still be used are used for replacing the damaged physical blocks, so as to prolong a lifespan of the flash memory storage system.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A block management and replacement method, for a flash memory storage system, wherein the flash memory storage system has a plurality of physical blocks, the block management and replacement method comprising:
   grouping the physical blocks into a plurality of physical units and grouping the physical units into a usage area and a replacement area;
   using a multi-planes accessing command to access the physical blocks grouped in each of the physical units;
   judging whether the number of the undamaged physical units in the replacement area is bigger than a predetermined value when one of the physical blocks of the physical unit in the usage area is damaged;
   if the number of the undamaged physical units in the replacement area is bigger than the predetermined value, selecting one of the undamaged physical units from the replacement area for replacing the physical unit having the damaged physical block in the usage area in a unit of the physical unit to be accessible by the multi-planes accessing command and recording the undamaged physical blocks or the damaged physical blocks within the replaced physical unit; and
   if the number of the undamaged physical units in the replacement area is not bigger than the predetermined value, selecting one of the undamaged physical blocks from the replacement area for replacing the damaged physical block in a unit of the physical block.

2. The block management and replacement method according to claim 1, further comprising dividing the physical units of the usage area into a data area and a spare area, wherein the physical units belonged to the spare area and the physical units belonged to the data area are alternately used for storing data.

3. The block management and replacement method according to claim 1, wherein each of the physical blocks has a redundant area, and the step of recording the undamaged physical blocks within the replaced physical unit comprises recording a mark in the redundant area of each of the undamaged physical blocks.

4. The block management and replacement method according to claim 1, wherein the step of recording the undamaged physical blocks within the replaced physical unit comprises recording the undamaged physical blocks in a replacement table.

5. A controller, for a flash memory storage system, wherein the flash memory storage system has a plurality of physical blocks, the controller comprising:
   a microprocessor unit;
   a host interface module, coupled to the microprocessor unit;
   a flash memory interface, coupled to the microprocessor unit;
   a buffer memory, couple to the microprocessor unit; and
   a memory management module, coupled to the microprocessor unit, and having a plurality of machine commands suitable, which when executed by the microprocessor unit, to implement a plurality of block management and replacement steps, and the block management and replacement steps comprising:
   grouping the physical blocks into a plurality of physical units and grouping the physical units into a usage area and a replacement area;

using a multi-planes accessing command to access the physical blocks grouped in each of the physical units judging whether the number of the undamaged physical units in the replacement area is bigger than a predetermined value when one of the physical blocks of the physical unit in the usage area is damaged;

if the number of the undamaged physical units in the replacement area is bigger than the predetermined value, selecting one of the undamaged physical units from the replacement area for replacing the physical unit having the damaged physical block in the usage area in a unit of the physical unit to be accessible by the multi-planes accessing command and recording the undamaged physical blocks or the damaged physical blocks within the replaced physical unit; and if the number of the undamaged physical units in the replacement area is not bigger than the predetermined value, selecting one of the undamaged physical blocks from the replacement area for replacing the damaged physical block in a unit of the physical block.

6. The controller according to claim 5, wherein the block management and replacement steps further comprise dividing the physical units of the usage area into a data area and a spare area, wherein the physical units belonged to the spare area and the physical units belonged to the data area are alternately used for storing data.

7. The controller according to claim 5, wherein each of the physical blocks has a redundant area, and the step of recording the undamaged physical blocks within the replaced physical unit comprises recording a mark in the redundant area of each of the undamaged physical blocks.

8. The controller according to claim 5, wherein the step of recording the undamaged physical blocks within the replaced physical unit comprises recording the undamaged physical blocks in a replacement table.

9. The controller according to claim 5, wherein the flash memory storage system is a flash drive, a memory card or a solid state drive.

10. A flash memory storage system, comprising:
a plurality of physical blocks;
a connector; and
a controller, electrically connected to the physical blocks and the connector, for executing a plurality of machine commands of a memory management module to implement a plurality of block management and replacement steps, and the block management and replacement steps comprising:
grouping the physical blocks into a plurality of physical units and grouping the physical units into a usage area and a replacement area;
using a multi-planes accessing command to access the physical blocks grouped in each of the physical units judging whether the number of the undamaged physical units in the replacement area is bigger than a predetermined value when one of the physical blocks of the physical unit in the usage area is damaged;

if the number of the undamaged physical units in the replacement area is bigger than the predetermined value, selecting one of the undamaged physical units from the replacement area for replacing the physical unit having the damaged physical block in the usage area in a unit of the physical unit to be accessible by the multi-planes accessing command and recording the undamaged physical blocks or the damaged physical blocks within the replaced physical unit; and if the number of the undamaged physical units in the replacement area is not bigger than the predetermined value, selecting one of the undamaged physical blocks from the replacement area for replacing the damaged physical block in a unit of the physical block.

11. The flash memory storage system according to claim 10, wherein the block management and replacement steps further comprise dividing the physical units of the usage area into a data area and a spare area, wherein the physical units belonged to the spare area and the physical units belonged to the data area are alternately used for storing data.

12. The flash memory storage system according to claim 10, wherein each of the physical blocks has a redundant area, and the step of recording the undamaged physical blocks within the replaced physical unit comprises recording a mark in the redundant area of each of the undamaged physical blocks.

13. The flash memory storage system according to claim 10, wherein the step of recording the undamaged physical blocks within the replaced physical unit comprises recording the undamaged physical blocks in a replacement table.

14. The flash memory storage system according to claim 10, wherein the physical blocks are belonged to multi block planes, and each of the physical units is consisted of at least two physical blocks belonged to the different block planes.

15. The flash memory storage system according to claim 14, wherein the block planes are belonged to one flash memory die.

16. The flash memory storage system according to claim 14, wherein the block planes are belonged to a plurality of flash memory dies.

17. The flash memory storage system according to claim 16, wherein the flash memory dies are belonged to a plurality of flash memory chips.

18. The flash memory storage system according to claim 16, wherein the flash memory dies are belonged to one flash memory chip.

* * * * *